(12) United States Patent
Harada et al.

(10) Patent No.: US 11,217,395 B2
(45) Date of Patent: Jan. 4, 2022

(54) CAPACITOR

(71) Applicant: Murata Manufacturing Co., Ltd., Nagaokakyo (JP)

(72) Inventors: Masatomi Harada, Nagaokakyo (JP); Junko Izumitani, Nagaokakyo (JP); Takeshi Kagawa, Nagaokakyo (JP); Hiroshi Matsubara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 234 days.

(21) Appl. No.: 16/448,366

(22) Filed: Jun. 21, 2019

(65) Prior Publication Data
US 2019/0311854 A1 Oct. 10, 2019

Related U.S. Application Data

(63) Continuation of application No. PCT/JP2018/026232, filed on Jul. 11, 2018.

(30) Foreign Application Priority Data

Jul. 26, 2017 (JP) .............................. JP2017-144681

(51) Int. Cl.
*H01G 4/33* (2006.01)
*H01G 4/012* (2006.01)
*H01G 4/228* (2006.01)
*H01L 27/04* (2006.01)
*H01L 21/822* (2006.01)
(Continued)

(52) U.S. Cl.
CPC ............... *H01G 4/33* (2013.01); *H01G 4/012* (2013.01); *H01G 4/228* (2013.01); *H01L 21/822* (2013.01); *H01L 27/04* (2013.01); *H01G 4/12* (2013.01); *H01G 4/30* (2013.01)

(58) Field of Classification Search
CPC ....................................................... H01G 4/33
See application file for complete search history.

(56) References Cited

U.S. PATENT DOCUMENTS 7,026,680 B2  4/2006  Baniecki et al.
8,907,449 B2  12/2014  Takahashi et al.
(Continued)

FOREIGN PATENT DOCUMENTS

JP  H04241449 A  8/1992
JP  H06151707 A  5/1994
(Continued)

OTHER PUBLICATIONS

International Search Report issued in PCT/JP2018/026232, dated Sep. 25, 2018.
(Continued)

*Primary Examiner* — Eric W Thomas
(74) *Attorney, Agent, or Firm* — Arent Fox LLP

(57) ABSTRACT

A capacitor that includes a substrate, a lower electrode on the substrate, a dielectric film on the lower electrode, an upper electrode on a part of the dielectric film, a protective layer that covers the lower electrode and the upper electrode, and an external electrode that penetrates the protective layer. The external electrode is formed only in a region defined by a periphery of the upper electrode in a plan view of the capacitor viewed from an upper surface thereof towards the substrate.

10 Claims, 9 Drawing Sheets

(51) Int. Cl.
 *H01G 4/12* (2006.01)
 *H01G 4/30* (2006.01)

(56) References Cited

U.S. PATENT DOCUMENTS

| | | |
|---|---|---|
| 2001/0001488 A1 | 5/2001 | Eastep et al. |
| 2004/0130849 A1* | 7/2004 | Kurihara ............... H01G 4/228 361/311 |
| 2004/0178436 A1 | 9/2004 | Baniecki et al. |
| 2011/0193194 A1 | 8/2011 | Takahashi et al. |

FOREIGN PATENT DOCUMENTS

| | | |
|---|---|---|
| JP | H10163437 A | 6/1998 |
| JP | 2000228499 A | 8/2000 |
| JP | 2004281446 A | 10/2004 |
| JP | 2010109014 A | 5/2010 |

OTHER PUBLICATIONS

Written Opinion of the International Searching Authority issued in PCT/JP2018/026232, dated Sep. 25, 2018.

* cited by examiner

CAPACITOR

CROSS REFERENCE TO RELATED APPLICATIONS

The present application is a continuation of International application No. PCT/JP2018/026232, filed Jul. 11, 2018, which claims priority to Japanese Patent Application No. 2017-144681, filed Jul. 26, 2017, the entire contents of each of which are incorporated herein by reference.

FIELD OF THE INVENTION

The present invention relates to a capacitor.

BACKGROUND OF THE INVENTION

As a typical capacitor element for use in semiconductor integrated circuits, for example, a MIM (Metal Insulator Metal) capacitor is well known. The MIM capacitor is a capacitor that has a parallel plate-type structure with an insulator sandwiched between a lower electrode and an upper electrode.

For example, Patent Document 1 discloses a technique for providing a thin film MIM capacitor that prevents insulation characteristics and leakage current characteristics from being degraded. The thin film MIM capacitor described in Patent Document 1 has a substrate, a lower electrode made of a noble metal formed on the substrate, a dielectric layer thin film formed on the lower electrode, and an upper electrode made of a noble metal formed on the dielectric thin film. The capacitor also includes an external electrode for electrically connecting the upper electrode and the lower electrode to the outside.

Patent Document 1: Japanese Patent Application Laid-Open No. 2010-109014

SUMMARY OF THE INVENTION

However, when the external electrode extends beyond a region where the upper electrode is formed, the external electrode and the lower electrode may come close to each other, thereby leading to capacitive coupling with a protective layer (also referred to as an interlayer film) interposed therebetween. As a result, parasitic capacitance made by the external electrode, the protective layer, and the lower electrode is generated, which is connected in parallel with the true capacitance made by the upper electrode, the dielectric film, and the lower electrode. In this specification, this parasitic capacitance is referred to as protective layer capacitance.

For example, in a capacitor that requires a Q value in an RF circuit, the presence of protective layer capacitance causes unnecessary parasitic capacitance in the capacitor, which in turn causes the Q value of the capacitor to be decreased. In addition, the protective layer capacitance fluctuates due to changes in properties of the protective layer material at high temperature or high humidity, which then causes the Q value of the capacitor to fluctuate.

The present invention has been made in view of such circumstances, and an object of the present invention is to provide a capacitor which has a high Q value even at high temperature or high humidity, with protective layer capacitance reduced.

A capacitor according to an aspect of the present invention includes a substrate, a lower electrode on the substrate, a dielectric film on the lower electrode, an upper electrode on a part of the dielectric film, a protective layer that covers the lower electrode and the upper electrode, and an external electrode that penetrates the protective layer. The external electrode is formed only in a region defined by a periphery of the upper electrode in a plan view of the capacitor viewed from an upper surface thereof towards the substrate.

According to the present invention, a capacitor can be provided which has a high Q value even at high temperature or high humidity, with protective layer capacitance reduced.

DETAILED DESCRIPTION OF THE INVENTION

First Embodiment

Figure 1:
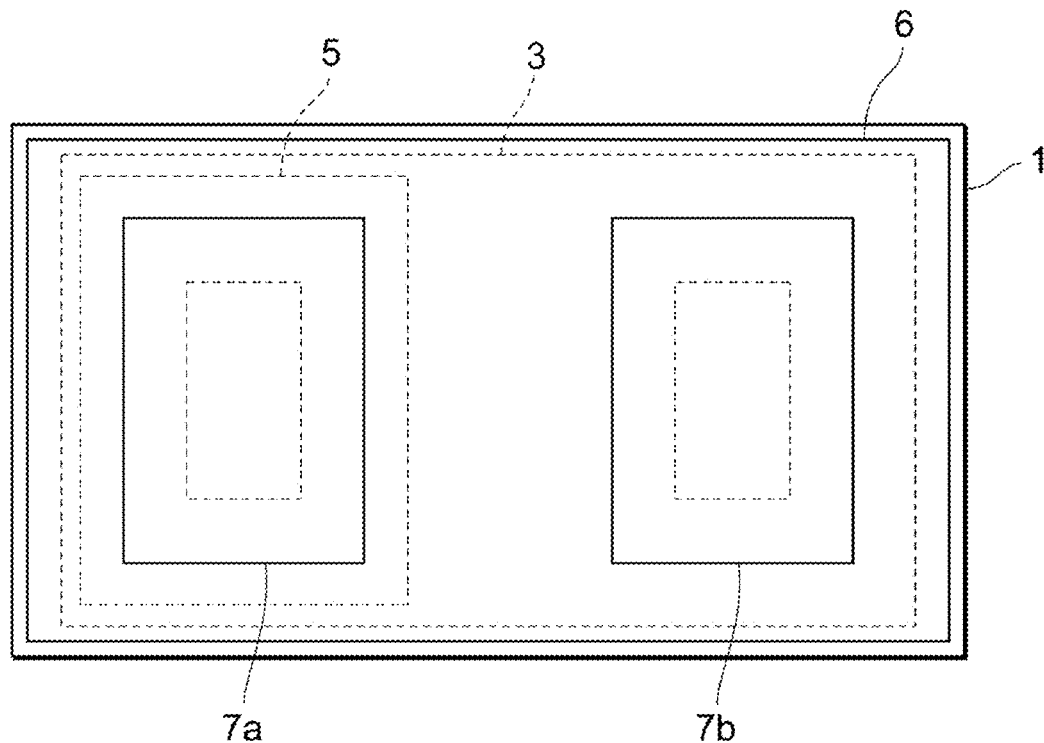
FIG. 1 is a top view of a capacitor according to a first embodiment.
Figure 2:
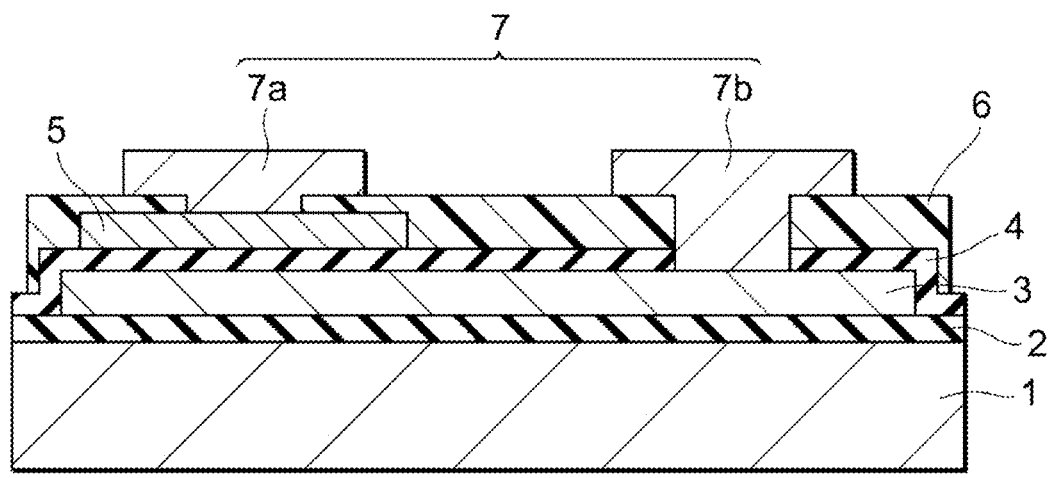
FIG. 2 is a cross-sectional view of the capacitor according to the first embodiment.

FIG. 1 is a top view (i.e., plan view) of a capacitor according to the present embodiment. FIG. 2 is a cross-sectional view of the capacitor according to the present embodiment. It is to be noted that the top view shown in FIG. 1 is not intended to directly show the appearance of the capacitor as viewed from above, but intended to show the layout of respective layers of the capacitor as viewed from above.

An insulating film 2 is formed on the substrate 1, and a lower electrode 3 is formed on the insulating film 2. A dielectric film 4 that covers the lower electrode 3 is formed on the insulating film 2 and the lower electrode 3. An upper electrode 5 is formed on a part of the dielectric film 4. A protective layer 6 that covers the lower electrode 3 and the upper electrode 5 is formed on the dielectric film 4 and the upper electrode 5. A first external electrode 7a that penetrates the protective layer 6, and a second external electrode 7b that penetrates the protective layer 6 and the dielectric film 4 are formed on the protective layer 6. The first external electrode 7a is connected to the upper electrode 5, and the second external electrode 7b is connected to the lower electrode 3. It is to be noted that the first external electrode 7a and the second external electrode 7b are simply referred to as an external electrode 7 in a case where it is not necessary to distinguish the electrodes.

According to the present embodiment, the first external electrode 7a is formed only in a region defined by the periphery of the upper electrode 5 in the plan view (FIG. 1) of the capacitor viewed from above (external electrode side). Hereinafter, an example of the material and thickness of each layer constituting the capacitor according to the present embodiment will be described.

The material of the substrate 1 is not limited, but the substrate 1 is preferably a semiconductor substrate such as a silicon substrate or a gallium arsenide substrate, or an insulating substrate such as glass or alumina. For example, the long side length of the substrate 1 is 200 µm to 600 µm, and the short side length is 100 µm to 300 µm. In addition, the thickness of the substrate is not limited, but is preferably 500 µm or more and 700 µm or less. If the thickness of the substrate is smaller than 500 µm, the mechanical strength of the substrate is weakened, and thus, in the manufacture of a capacitor as described later, the wafer is cracked or chipped in the case of back grinding or cutting with a dicing machine. If the thickness of the substrate is larger than 700 µm, the thickness will be thicker than the vertical and horizontal lengths of the capacitor, thereby making it difficult to handle the capacitor in the case of mounting. In addition, the thickness of the whole capacitor including the substrate is preferably 10 µm or more and 300 µm or less.

The material of the insulating film 2 is not limited, but the insulating film 2 is preferably an insulating film made of $SiO_2$, SiN, $Al_2O_3$, $HfO_2$, $Ta_2O_5$, $ZrO_2$ or the like. The thickness of the insulating film is not limited, as long as the substrate and the capacitor formed on the substrate can be insulated, and the thickness is preferably 0.1 µm or more. The insulating film 2 can be formed by a sputtering method or a CVD (chemical vapor deposition) method.

The material of the lower electrode 3 is not limited, but is preferably a metal made of Cu, Ag, Au, Al, Ni, Cr, Ti or the like, or a conductor containing these metals. The thickness of the lower electrode is not limited, but is preferably 0.5 µm or more and 10 µm or less, and more preferably 2 µm or more and 6 µm or less. If the lower electrode thickness is smaller than 0.5 µm, the resistance of the electrode is increased, thereby affect the high frequency characteristics of the capacitor. If the lower electrode thickness is larger than 10 µm, the stress of the electrode weakens the mechanical strength of the element, thereby possibly distorting the capacitor.

The material of the dielectric film 4 is not limited, but is preferably an oxide or a nitride such as $SiO_2$, SiN, $Al_2O_3$, $HfO_2$, $Ta_2O_5$, or $ZrO_2$. The thickness of the dielectric film is not particularly limited, but is preferably 0.1 µm or more and 1.5 µm or less, and adjusted in accordance with a desired capacitance value. The dielectric film 4 can be formed by a sputtering method or a CVD method.

The material of the upper electrode 5 is not limited, but is preferably a metal made of Cu, Ag, Au, Al, Ni, Cr, Ti or the like, or a conductor containing these metals. The thickness of the upper electrode 5 is not limited, but is preferably 0.5 µm or more and 10 µm or less, more preferably 2 µm or more and 6 µm or less, for the same reason as the lower electrode 3, for the same reason as for the lower electrode 3. In addition, the thickness of the lower electrode 3 is preferably larger than the thickness of the upper electrode 5. The length of the lower electrode 3 is larger than the length of the upper electrode 5. The reason is that if the thickness of the lower electrode 3 is small, the equivalent series resistance (ESR) is increased.

The material of the protective layer 6 is not particularly limited, but is preferably a resin material such as polyimide. The thickness of the protective layer 6 is not limited, but is preferably 1 µm or more and 20 µm or less. If the thickness of the protective layer is smaller than 1 µm, it may be impossible to eliminate the level difference of the base, thereby possibly failing to obtain a smooth surface. When an attempt is made to make the thickness of the protective layer 6 larger than 20 µm, a high-viscosity protective layer material is required, which makes it difficult to control the thickness, thereby causing variation in capacitance. In addition, the periphery of the protective layer 6 may be located between an end of the substrate 1, cut with a dicing machine, and the side wall of the dielectric film 4 covering the lower electrode 3, as viewed from the top. The dielectric film on the side wall part of the lower electrode 3 may have a thickness made smaller, or the level-difference portion may have no dielectric film deposited, and in a case where the capacitor according to the present embodiment is mounted by soldering, the solder and the lower electrode 3 can be avoided from coming into contact with each other.

The material of the external electrode 7 is not limited, but is preferably a material that is lower in resistivity than the materials of the lower electrode 3 and the upper electrode 5, and preferably a metal made of Cu, Al or the like. This is because the material makes it possible to lower the resistance. In a case where mounting by soldering is assumed, the outermost surface of the external electrode 7 may be Au or Sn.

According to the present embodiment, the first external electrode 7a is formed only in a region defined by the periphery of the upper electrode 5 in the plan view of the capacitor viewed from an upper surface thereof towards the substrate (FIG. 1). With this structure, the lines of electric force between the upper electrode 5 and the lower electrode 3 pass only through the dielectric film 4 when a voltage is applied. Since the first external electrode 7a is not formed outside the upper electrode 5, the first external electrode 7a is not capacitively coupled to the lower electrode 3 with the protective layer 6 interposed therebetween.

Figure 3:
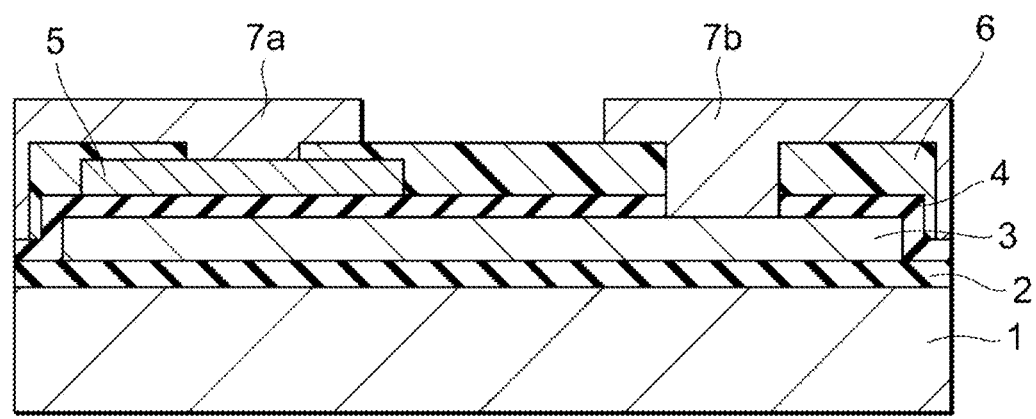
FIG. 3 is a cross-sectional view of a capacitor according to a comparative example.

On the other hand, the structure of the comparative example shown in FIG. 3 has a first external electrode 7a that extends to the outside of the upper electrode 5. Thus, when a voltage is applied, some of lines of electric force from the first external electrode 7a pass through a protective layer 6, and then enter a lower electrode 3. As a result, a protective layer capacitance made by the first external electrode 7a, the protective layer 6, and the lower electrode 3 is generated, the protective layer capacitance being connected in parallel with the true capacitance made by the upper electrode 5, the dielectric film 4, and the lower electrode 3. For example, in a capacitor that requires a high Q value in an RF circuit, the presence of protective layer capacitance causes unnecessary parasitic capacitance in the capacitor, which causes the Q value of the capacitor to be decreased. In addition, the protective layer capacitance fluctuates due to changes in properties of the protective layer material at high temperature or high humidity, which causes the Q value of the capacitor to fluctuate.

According to the present embodiment, the first external electrode 7a and the lower electrode 3 are not capacitively coupled with the protective layer 6 interposed therebetween, thereby making it possible to eliminate the influence of the protective layer 6 from the Q value of the whole capacitor. Accordingly, the influence on the Q value can be eliminated, the influence being generated due to the parasitic capacitance of the protective layer 6 and the changes in the properties of the protective layer material (interlayer material) at high temperature or high humidity.

In addition, according to the present embodiment, since the upper electrode 5 and the lower electrode 3 are also not capacitively coupled with the substrate 1 interposed therebetween, the fluctuation in substrate capacitance will not affect the overall capacitance when a voltage is applied. As just described, the substrate capacitance is not apparent, thus making it possible to prevent the substrate capacitance from affecting the frequency characteristics of the overall capacitance.

Furthermore, according to the present embodiment, the external electrode 7 is flattened in shape, without being formed on the side wall part of the protective layer 6. When the upper electrode 5 or the protective layer 6 has a level difference, the metal film that forms the external electrode 7 is broken at the level difference, or the electric field is concentrated on the level difference at the time of voltage application, which adversely affects the insulation tolerance of the capacitor. The present embodiment can suppress such a defect to improve the insulation tolerance of the capacitor.

Next, a method for manufacturing the capacitor according to the present embodiment will be described with reference to FIGS. 4 to 9.

Figure 4:
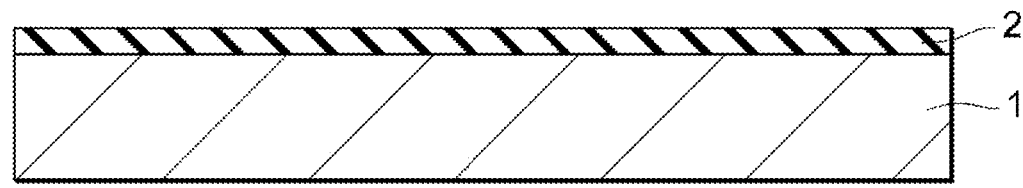
FIG. 4 is a process cross-sectional view of the capacitor according to the first embodiment.

As shown in FIG. 4, the insulating film 2 is formed on the substrate 1. The insulating film 2 is preferably an insulating film made of $SiO_2$, SiN, or $Al_2O_3$. The insulating film 2 can be formed by a sputtering method or a CVD (chemical vapor deposition) method. The thickness of the insulating film 2 is preferably 0.1 µm or more.

Figure 5:
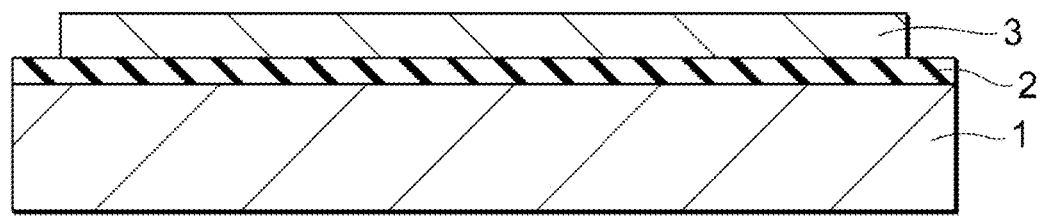
FIG. 5 is a process cross-sectional view of the capacitor according to the first embodiment.

Next, as shown in FIG. 5, a pattern for the lower electrode 3 is formed on the insulating film 2. For example, a metal made of Cu, Ag, Au, or Al, or a conductor containing these metals is deposited as the lower electrode 3. The thickness of the lower electrode 3 is preferably 0.5 µm or more and 10 µm or less, and more preferably 2 to 6 µm. Although there is no limitation on the method of pattern formation for the lower electrode 3, for example, a semi-additive method is used. In accordance with the semi-additive method, a seed layer is deposited by sputtering or electroless plating, a resist pattern for opening in a part of the seed layer is formed by a technique of photolithography, a lower electrode material is formed in the opening by electroless plating, the resist is stripped, and finally, the seed layer at the site where the lower electrode material is not formed is removed.

Figure 6:
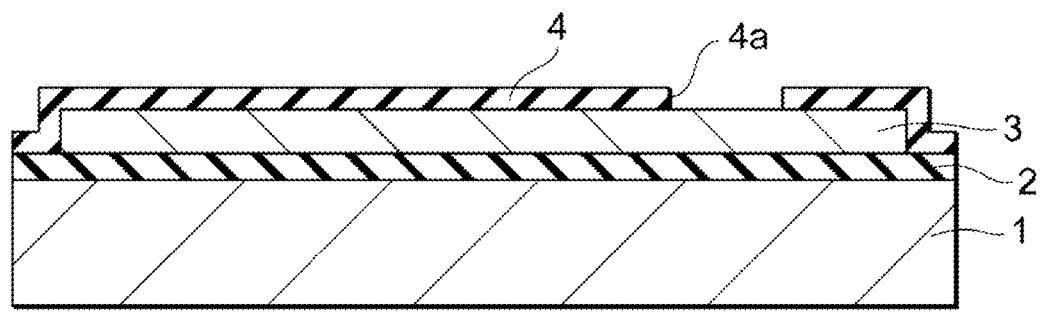
FIG. 6 is a process cross-sectional view of the capacitor according to the first embodiment.

Next, as shown in FIG. 6, the dielectric film 4 is formed on the entire surface of the substrate including the region of the lower electrode 3, and patterning is carried out to form an opening 4a for exposing a part of the dielectric film 4. As the dielectric film 4, for example, an oxide or nitride of $SiO_2$, SiN, $Al_2O_3$, $HfO_2$, $Ta_2O_5$, or the like is formed to have a thickness of 0.1 µm or more 1.5 µm or less. The dielectric film 4 can be formed by a sputtering method or a CVD method. The patterning is carried out by, for example, photolithography and etching.

Figure 7:
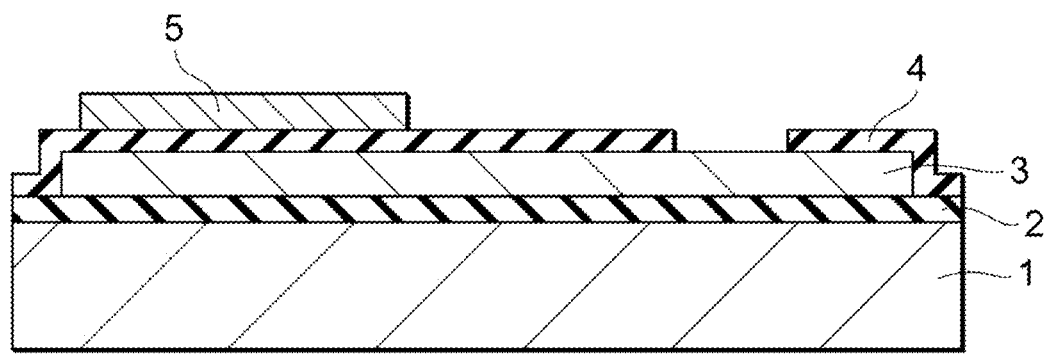
FIG. 7 is a process cross-sectional view of the capacitor according to the first embodiment.

Next, as shown in FIG. 7, a pattern for the upper electrode 5 is formed on a part of the dielectric film 4. For example, a metal made of Cu, Ag, Au, or Al, or a conductor containing these metals is deposited as the upper electrode 5. The thickness of the upper electrode 5 is preferably 0.5 µm or more and 10 µm or less, and more preferably 2 to 6 µm. Although there is no limitation on the method of pattern formation for the upper electrode 5, for example, a semi-additive method is used as in the case of the lower electrode 3.

Figure 8:
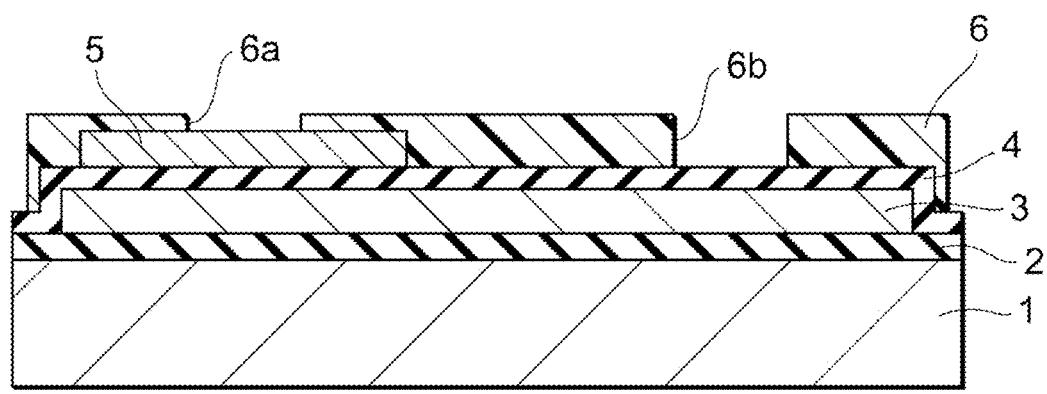
FIG. 8 is a process cross-sectional view of the capacitor according to the first embodiment.

Next, as shown in FIG. 8, the protective layer 6 is deposited, and subjected to patterning to form an opening 6a for exposing the upper electrode 5 and an opening 6b for exposing the dielectric film 4 in protective layer 6. For example, a resin material such as polyimide is deposited as the protective layer 6. The thickness of the protective layer 6 is preferably 1 to 20 µm. In the patterning, a resist pattern is formed on the protective layer 6 by a technique of photolithography, and unnecessary portions of the protective layer 6 are etched with the resist pattern as a mask.

Figure 9:
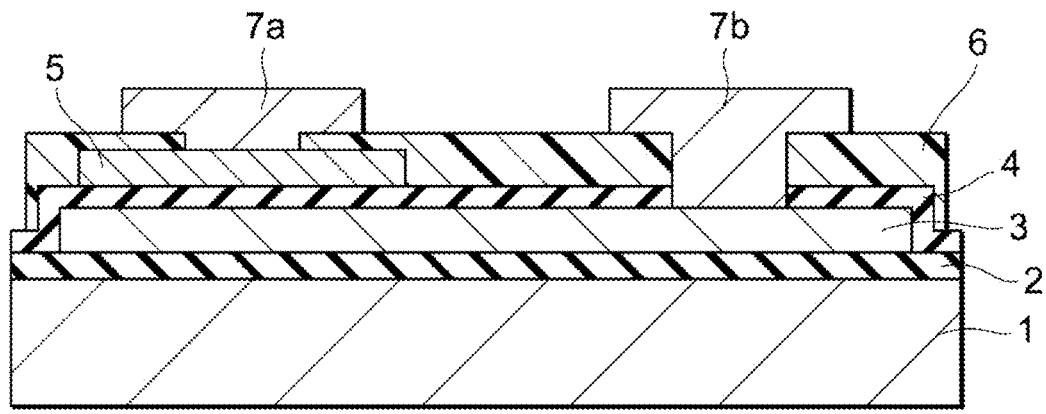
FIG. 9 is a process cross-sectional view of the capacitor according to the first embodiment.

Next, as shown in FIG. 9, patterns for the first external electrode 7a and the second external electrode 7b are formed to fill the openings 6a, 6b of the protective layer 6, respectively. According to the present embodiment, the first external electrode 7a is formed only in the region defined by the periphery of the upper electrode 5. Preferably, the external electrode 7 is formed only on the upper surface of the protective layer 6, and the external electrode 7 is not formed on the side wall of the protective layer 6. For example, Cu or Al is used as the external electrode 7. The external electrode 7 made of Cu or Al can be formed by sputtering or plating. In addition, the external electrode 7 is preferably plated with Ni/Au. Although there is no limitation on the method of pattern formation for the external electrode 7, for example, a semi-additive method is used, as in the case of the lower electrode 3.

The capacitor according to the present embodiment is manufactured in the way described above.

Second Embodiment

In the second embodiment and the subsequent sections, descriptions of common matters with the first embodiment will be omitted, and only differences will be described. Particularly, the similar functions and effects achieved by similar configurations will not be mentioned sequentially for each embodiment.

Figure 10:
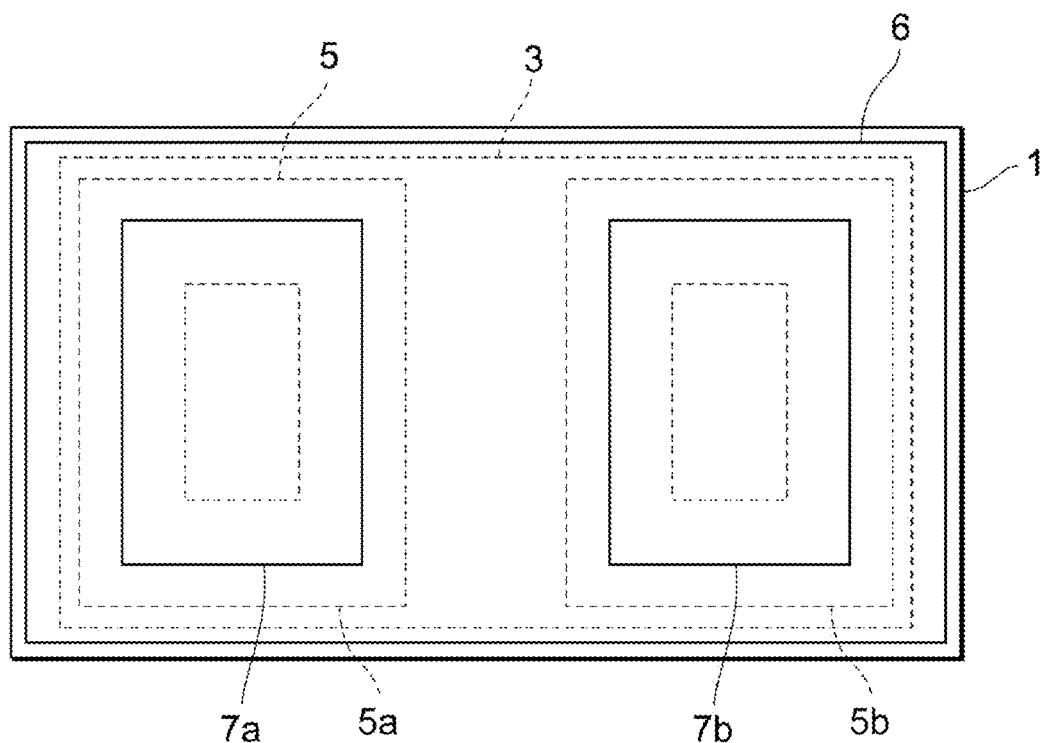
FIG. 10 is a top view of a capacitor according to a second embodiment.
Figure 11:
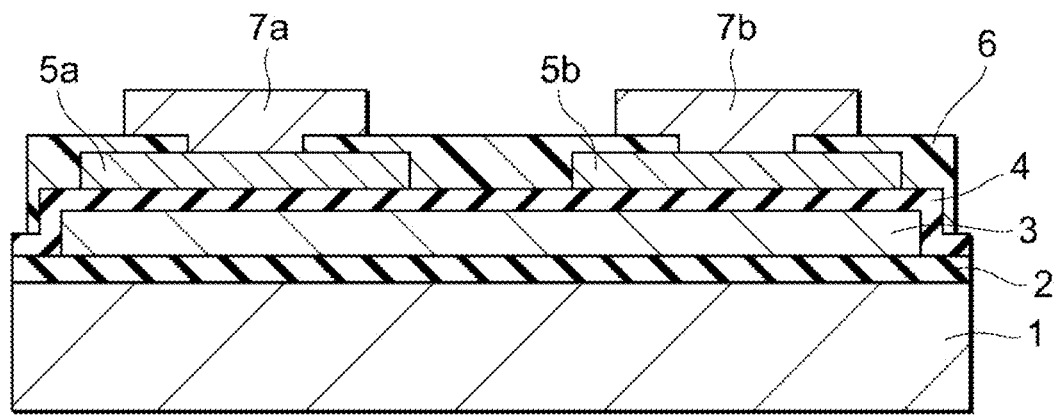
FIG. 11 is a cross-sectional view of the capacitor according to the second embodiment.

FIG. 10 is a top view of a capacitor according to the second embodiment. FIG. 11 is a cross-sectional view of the capacitor according to the second embodiment.

The capacitor according to the second embodiment includes, as an upper electrode, a first upper electrode 5a and a second upper electrode 5b separately formed on a dielectric film 4. An external electrode 7 includes a first external electrode 7a connected to the first upper electrode 5a and a second external electrode 7b connected to the second upper electrode 5b. The first external electrode 7a is formed only in the region defined by the periphery of the first upper electrode 5a, and the second external electrode 7b is formed only in the region defined by the periphery of the second upper electrode 5b.

The capacitor according to the second embodiment is a capacitor in which two capacitors formed between the first upper electrode 5a and the lower electrode 3 and between the second upper electrode 5b and the lower electrode 3 are connected in series. Accordingly, the combined capacitance of the capacitors is smaller than the capacitance value of each capacitor.

In the capacitor according to the first embodiment, in the case of configuring a low-capacitance capacitor, there is a need to reduce the area of the upper electrode 5, thereby possibly making it difficult to form the first external electrode 7a only in the region defined by the periphery of the upper electrode 5. On the other hand, according to the second embodiment, even in the case of forming a low-capacitance capacitor, there is no need to reduce the areas of the upper electrodes 5a, 5b, thereby making it possible to form the external electrodes 7a, 7b only in the areas defined by the peripheries of the upper electrodes 5a, 5b. As a result, the external electrodes 7a, 7b and the lower electrode 3 are not capacitively coupled with the protective layer 6 interposed therebetween, thus making it possible to prevent the Q value of the capacitor from being decreased due to the protective layer capacitance.

In addition, the capacitor according to the second embodiment has a bilaterally symmetrical structure, and it is thus not necessary to care about the capacitor orientation at the time of packaging or mounting. In addition, since the effective dielectric film thickness is doubled, the insulation can be improved.

Third Embodiment

Figure 12:
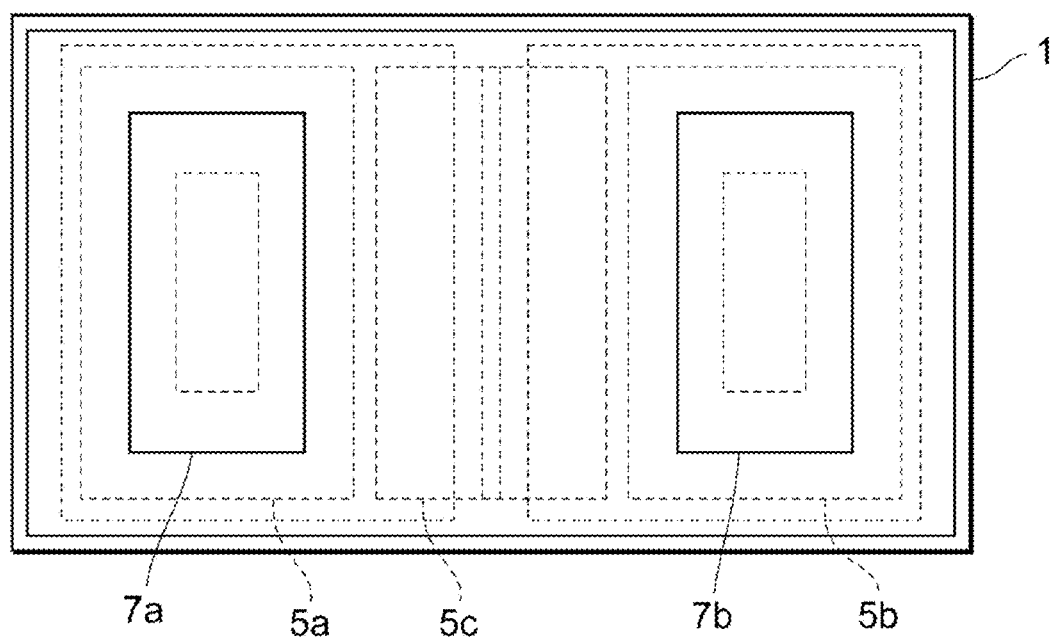
FIG. 12 is a top view of a capacitor according to a third embodiment.
Figure 13:
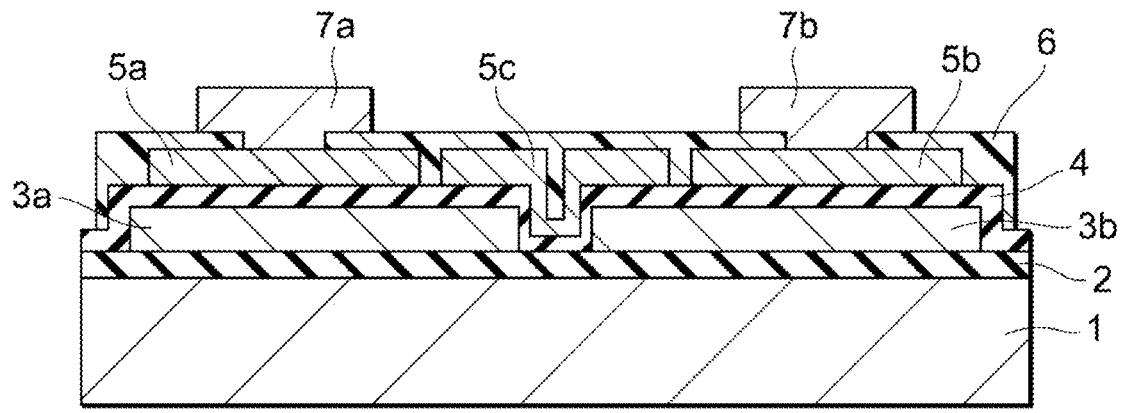
FIG. 13 is a cross-sectional view of the capacitor according to the third embodiment.
Figure 14:
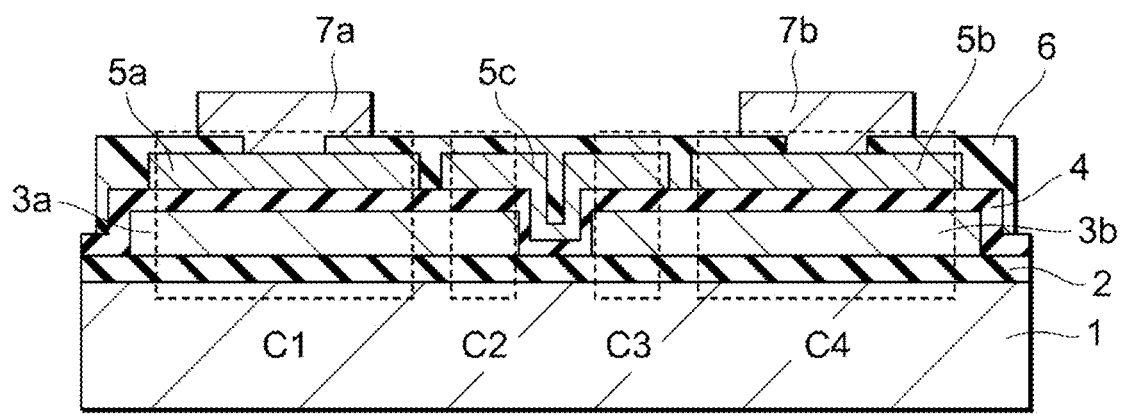
FIG. 14 is a cross-sectional view illustrating the capacitance formed by the capacitor according to the third embodiment.

FIG. 12 is a top view of a capacitor according to the third embodiment. FIG. 13 is a cross-sectional view of the capacitor according to the third embodiment. FIG. 14 is a cross-sectional view illustrating the capacitance formed by the capacitor according to the third embodiment.

Unlike the second embodiment, the capacitor according to the third embodiment includes, as a lower electrode, a first lower electrode 3a and a second lower electrode 3b separately formed on the insulating film 2. A dielectric film 4 is formed so as to surround the upper and side surfaces of the two lower electrodes 3a, 3b. According to the third embodiment, a first upper electrode 5a formed on the first lower electrode 3a, a second upper electrode 5b formed on the second lower electrode 3b, and a third upper electrode 5c formed across the first lower electrode 3a and the second lower electrode 3b are formed as an upper electrode.

As shown in FIG. 14, according to the third embodiment, a capacitor C1 composed of the first lower electrode 3a and the first upper electrode 5a, and a capacitor C2 composed of the first lower electrode 3a and the third upper electrode 5c, a capacitor C3 composed of the second lower electrode 3b and the third upper electrode 5c, and a capacitor C4 composed of the second lower electrode 3b and the second upper electrode 5b are formed. The capacitors C1 to C4 are connected in series as a whole capacitor.

According to the third embodiment, without reducing the areas of the upper electrodes 5a, 5b, a capacitor that is much lower in capacitance than the second embodiment can be achieved while keeping the external electrodes 7a, 7b configured to be formed only in the regions defined by the peripheries of the upper electrodes 5a, 5b. As a result, a low-capacitance capacitor can be provided which has a high Q value even at high temperature or high humidity, with protective layer capacitance reduced.

In addition, as in the second embodiment, the capacitor according to the third embodiment has a bilaterally symmetrical structure, and it is thus not necessary to care about the capacitor orientation at the time of packaging or mounting. In addition, since the effective dielectric film thickness is quadrupled, the insulation can be improved.

Fourth Embodiment

Figure 15:
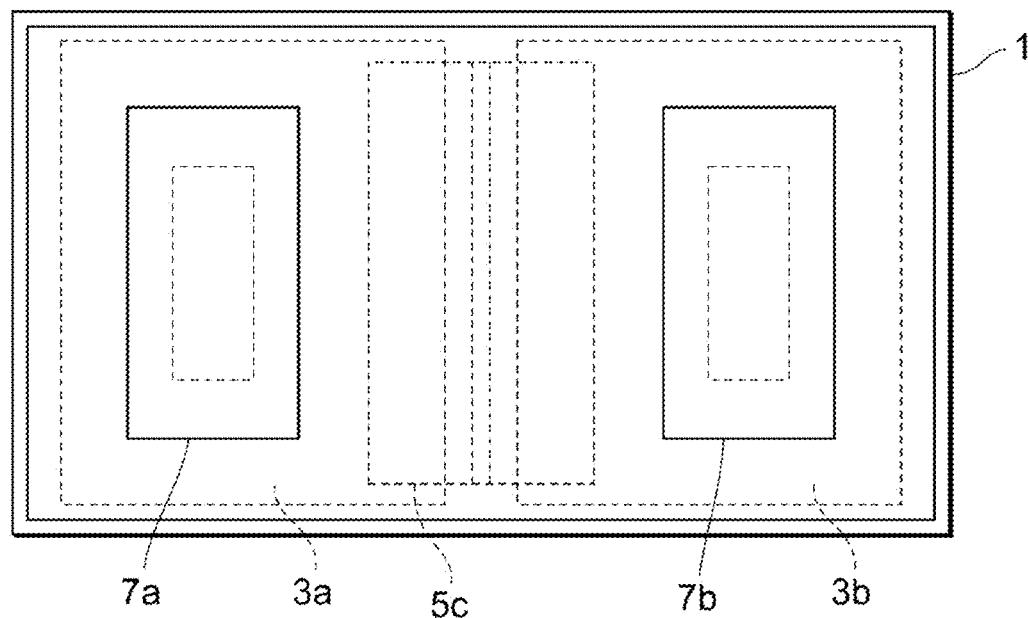
FIG. 15 is a top view of a capacitor according to a fourth embodiment.
Figure 16:
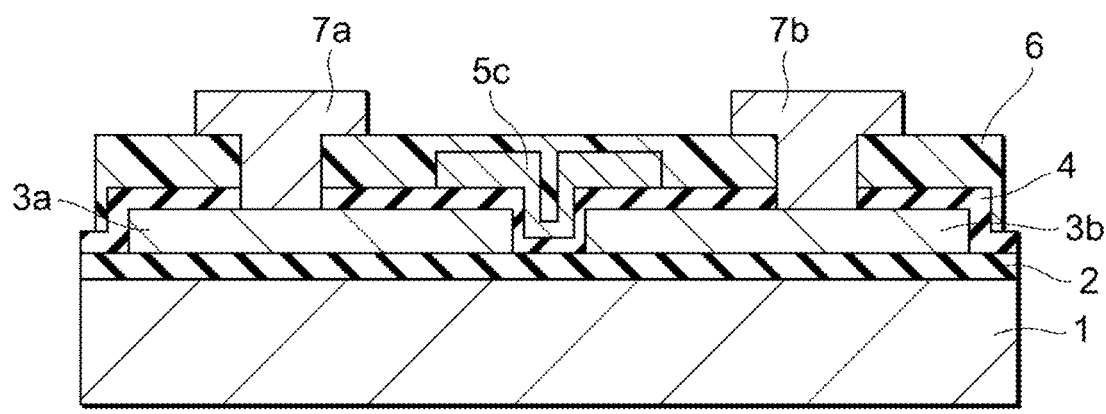
FIG. 16 is a cross-sectional view of the capacitor according to the fourth embodiment.
Figure 17:
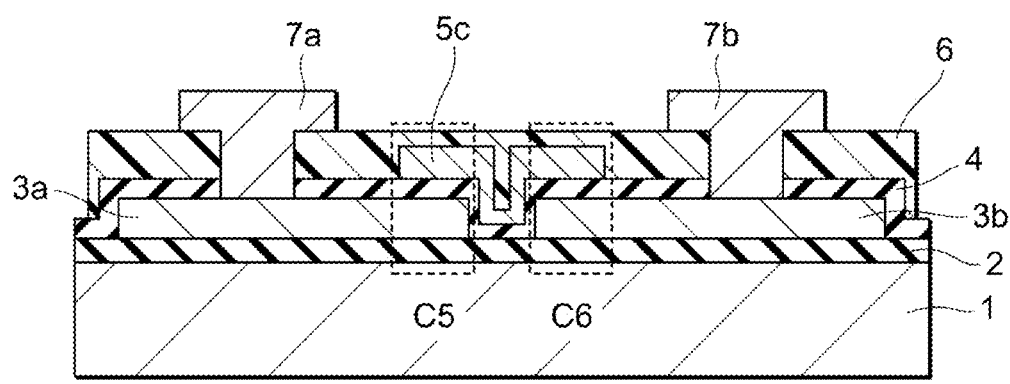
FIG. 17 is a cross-sectional view illustrating the capacitance formed by the capacitor according to the fourth embodiment.

FIG. 15 is a top view of a capacitor according to the fourth embodiment. FIG. 16 is a cross-sectional view of the capacitor according to the fourth embodiment. FIG. 17 is a cross-sectional view illustrating the capacitance formed by the capacitor according to the fourth embodiment.

The capacitor according to the fourth embodiment has, without the first upper electrode 5a and the upper electrode 5b according to the third embodiment, a first external electrode 7a and a second external electrode 7b respectively connected to a first lower electrode 3a and a second lower electrode 3b.

More specifically, the capacitor according to the fourth embodiment includes a substrate 1, an insulating film 2 formed on the substrate 1, a first lower electrode 3a and a second lower electrode 3b formed apart from each other on the substrate 1, and a dielectric film 4 formed on the first lower electrode 3a and the second lower electrode 3b, an upper electrode 5c formed on the dielectric film 4 across the first lower electrode 3a and the second lower electrode 3b, a protective layer 6 that covers the lower electrodes 3a, 3b and the upper electrode 5c, and the first external electrode 7a and the second external electrode 7b connected through the protective layer 6 respectively to the first lower electrode 3a and the second lower electrode 3b. Further, the first external electrode 7a and the second external electrode 7b are formed so as not to overlap with the upper electrode 5c in the plan view of the capacitor viewed from an upper surface thereof towards the substrate (FIGS. 15 and 16).

As shown in FIG. 17, according to the fourth embodiment, a capacitor C5 composed of the first lower electrode 3a and the upper electrode 5c and a capacitor C6 composed of the second lower electrode 3b and the upper electrode 5c are formed. The capacitors C5, C6 are connected in series as a whole capacitor.

According to the fourth embodiment, the external electrodes 7a, 7b are connected to the lower electrodes 3a, 3b, and there is thus no parasitic capacitance generated by the protective layer 6 sandwiched between the external electrodes 7a, 7b and the lower electrodes 3a, 3b. As a result, a low-capacitance capacitor can be provided which has a high Q value even at high temperature or high humidity, with protective layer capacitance reduced.

In addition, as in the second embodiment, the capacitor according to the fourth embodiment has a bilaterally symmetrical structure, and it is thus not necessary to care about the capacitor orientation at the time of packaging or mounting. In addition, since the effective dielectric film thickness is doubled, the insulation can be improved.

Further, as in the third and fourth embodiments, the numbers of lower electrodes and upper electrodes are increased between the two external electrodes 7a and 7b, and connected in series, thereby making it possible to prepare a low-capacitance capacitor. The numbers of upper and lower electrodes are not limited to two, and more electrodes can be formed. In addition, the external electrodes may be connected to either the upper electrode or the lower electrode without any problem, and one of the two external electrodes may be connected to the upper electrode, whereas the other may be connected to the lower electrode.

The exemplary embodiments of the present invention have been described above.

The capacitor according to the present embodiment includes the substrate 1, the lower electrode 3 formed on the substrate 1, the dielectric film 4 formed on the lower electrode 3, the upper electrode 5 formed on a part of the dielectric film 4, the protective layer 6 that covers the lower electrode 3 and the upper electrode 5, and the external electrode 7a that penetrates the protective layer 6. The external electrode 7a is formed only in the region defined by the periphery of the upper electrode 5 in the plan view of the capacitor viewed from the upper surface thereof towards the substrate (FIGS. 1 and 2). The above-mentioned configuration can eliminate the influence of the protective layer 6 from the Q value of the whole capacitor, because there is no capacitive coupling with the protective layer 6 interposed. Accordingly, the influence on the Q value can be eliminated, the influence being generated due to the parasitic capacitance of the protective layer 6 and the changes in the properties of the interlayer film material at high temperature or high humidity.

In addition, the upper electrode may include the first upper electrode 5a and the second upper electrode 5b formed separately, whereas the external electrode may include the first external electrode 7a connected to the first upper electrode 5a and the second external electrode 7b connected to the second upper electrode 5b, and the first external electrode 7a may be formed only in the region defined by the periphery of the first upper electrode 5a, whereas the second external electrode 7b may be formed only in the region defined by the periphery of the second upper electrode 5b (FIGS. 10 and 11). Thus, two capacitors formed between the first upper electrode 5a and the lower electrode 3 and between the second upper electrode 5b and the lower electrode 3 are connected in series, thereby making the combined capacitance of the capacitors lower than the capacitance value of the capacitor. Accordingly, a low-capacitance capacitor can be prepared without reducing the areas of the upper electrodes 5a and 5b. In addition, the effective dielectric film thickness is increased, thereby making it possible to increase the insulation tolerance.

In addition, the lower electrode may include the first lower electrode 3a and second lower electrode 3b formed separately, and the upper electrode may include the first upper electrode 5a formed on the first lower electrode 3a, the second upper electrode 5b formed on the second lower electrode 3b, and the third upper electrode 5c formed across the first lower electrode 3a and the second lower electrode 3b (FIGS. 12 and 13). Thus, the capacitors C1 to C4 are connected in series (FIG. 14), thereby making it possible to prepare a low-capacitance capacitor without reducing the areas of the upper electrodes 5a, 5b.

In addition, the capacitor according to another embodiment include the substrate 1, the first lower electrode 3a and the second lower electrode 3b formed apart from each other on the substrate 1, the dielectric film 4 formed on the first lower electrode 3a and the second lower electrode 3b, the upper electrode 5c formed on the dielectric film 4 across the first lower electrode 3a and the second lower electrode 3b, the protective layer 6 that covers the lower electrodes 3a, 3b and the upper electrode 5c, and the first external electrode 7a and the second external electrode 7b connected through the protective layer 6 respectively to the first lower electrode 3a and the second lower electrode 3b, and the first external electrode 7a and the second external electrode 7b are formed so as not to overlap the upper electrode 5c in the plan view of the capacitor viewed from the upper surface thereof towards the substrate (FIGS. 15 and 16). The above-mentioned configuration can eliminate the influence of the protective layer 6 from the Q value of the whole capacitor, because there is no capacitive coupling with the protective layer 6 sandwiched. Accordingly, the influence on the Q value can be eliminated, the influence being generated due to the parasitic capacitance of the protective layer 6 and the changes in the properties of the interlayer film material at high temperature or high humidity.

It is to be noted that the respective embodiments described above are intended to facilitate understanding of the present invention, but not intended to construe the present invention in any limited way. Modifications and/or improvements can be made to the present invention without departing from the spirit of the present invention, and the present invention encompasses equivalents thereof. More specifically, the scope of the present invention also encompasses therein the respective embodiments with design changes appropriately made thereto by one skilled in the art, as long as the embodiments have the features of the present invention. For example, the respective elements included in the respective embodiments, and the layout, materials, conditions, shapes, sizes, and the like of the elements are not to be considered limited to those exemplified, but can be changed appropriately. Furthermore, the dimensional ratios of the drawings are not to be considered limited to the illustrated ratios. Furthermore, obviously, the following respective embodiments are considered by way of example, and it is possible to partially substitute or combine configurations presented in the different embodiments, and the scope of the present invention encompasses therein the foregoing substitutions and combinations, as long as the substitutions and the combinations include the features of the present invention.

DESCRIPTION OF REFERENCE SYMBOLS

1: Substrate
2: Insulating film
3, 3a, 3b: Lower electrode
4: Dielectric film
4a: Opening
5, 5a, 5b, 5c: Upper electrode
6: Protective layer
6a, 6b: Opening
7, 7a, 7b: External electrode

The invention claimed is:
1. A capacitor comprising:
a substrate;
a lower electrode on the substrate, the lower electrode having an upper surface opposite the substrate and side surfaces extending from the upper surface toward the substrate;
a dielectric film on the upper surface and side surfaces of the lower electrode;
a first upper electrode on a first part of the dielectric film;
a second upper electrode on a second part of the dielectric film;
a protective layer covering the lower electrode and the first upper electrode and the second upper electrode;
a first external electrode that penetrates the protective layer and is electrically connected to the first upper electrode, and wherein the first external electrode is formed only in a first region defined by a first periphery of the first upper electrode in a plan view of the capacitor viewed from an upper surface thereof towards the substrate; and
a second external electrode that penetrates the protective layer and is electrically connected to the second upper electrode, and wherein the second external electrode is formed only in a second region defined by a second periphery of the second upper electrode in the plan view of the capacitor viewed from the upper surface thereof towards the substrate.

2. The capacitor according to claim 1, wherein
the lower electrode includes a first lower electrode and a second lower electrode,
the first upper electrode covers a part of the first lower electrode, and
the second upper electrode covers a part of the second lower electrode.

3. The capacitor according to claim 2, further comprising a third upper electrode that extends across the first lower electrode and the second lower electrode.

4. The capacitor according to claim 1, further comprising an insulating film between the substrate and the lower electrode.

5. A capacitor comprising:
a substrate;
a first lower electrode on the substrate;
a second lower electrode on the substrate and separate from the first lower electrode;
a dielectric film on the first lower electrode and the second lower electrode;
an upper electrode on a part of the dielectric film and that extends across the first lower electrode and the second lower electrode;
a protective layer covering the first lower electrode, the second lower electrode, and the upper electrode;
a first external electrode that penetrates the protective layer and is electrically connected to the first lower electrode; and
a second external electrode that penetrates the protective layer and is electrically connected to the second lower electrode,
wherein the first external electrode and the second external electrode are formed so as not to overlap with the upper electrode in a plan view of the capacitor viewed from an upper surface thereof towards the substrate.

6. The capacitor according to claim 5, further comprising an insulating film between the substrate and the first lower electrode and the second lower electrode.

7. A method of manufacturing a capacitor, the method comprising:
forming a lower electrode on a substrate, the lower electrode having an upper surface opposite the substrate and side surfaces extending from the upper surface toward the substrate;
forming a dielectric film on the upper surface and side surfaces of the lower electrode;
forming a first upper electrode on a first part of the dielectric film;
forming a second upper electrode on a second part of the dielectric film;
covering the lower electrode and the first upper electrode and the second upper electrode with a protective layer;
forming a first external electrode only in a first region defined by a first periphery of the first upper electrode in a plan view of the capacitor viewed from an upper surface thereof towards the substrate, the first external electrode penetrating the protective layer and being electrically connected to the first upper electrode;
forming a second external electrode only in a second region defined by a second periphery of the second upper electrode in the plan view of the capacitor viewed from the upper surface thereof towards the substrate, the second external electrode penetrating the protective layer and being electrically connected to the second upper electrode.

8. The method of manufacturing a capacitor according to claim 7, wherein
the lower electrode is formed so as to include a first lower electrode and a second lower electrode,
the first upper electrode is formed in a location that covers a part of the first lower electrode, and
the second upper electrode is formed in a location that covers a part of the second lower electrode.

9. The method of manufacturing a capacitor according to claim 8, further comprising forming a third upper electrode that extends across the first lower electrode and the second lower electrode.

10. The method of manufacturing a capacitor according to claim 7, further comprising forming an insulating film between the substrate and the lower electrode.

* * * * *